United States Patent [19]
Tohmon

[11] Patent Number: 5,301,063
[45] Date of Patent: Apr. 5, 1994

[54] METHOD OF PRODUCING LED LENS ARRAY

[75] Inventor: Ryoichi Tohmon, Tokyo, Japan

[73] Assignee: Eastman Kodak Company, Rochester, N.Y.

[21] Appl. No.: 818,632

[22] Filed: Jan. 6, 1992

[30] Foreign Application Priority Data

Jan. 28, 1991 [JP] Japan ................... 3-008750

[51] Int. Cl.$^5$ ............................. G02B 27/10
[52] U.S. Cl. .................. 359/619; 359/620; 359/900
[58] Field of Search ............... 359/619–620, 359/741–743, 900

[56] References Cited

U.S. PATENT DOCUMENTS 3,981,023  9/1976  King et al. ............... 359/620
4,667,092  5/1987  Ishihara .................. 359/619

*Primary Examiner*—Bruce Y. Arnold
*Assistant Examiner*—James Phan
*Attorney, Agent, or Firm*—Thomas H. Close

[57] ABSTRACT

A method of fabricating an LED lens array which uses light of the constituent LEDs of the LED array as a light source for directly forming lenses on the LED array. This simplifies the fabrication process and decreases attenuation. The method involves depositing a mask in a desired pattern upon a substrate member bearing an n-type conductivity layer and, subsequently, forming a p-n junction therein by diffusion of an impurity into the n-type conductivity region to form a p-type conductivity region in a portion thereof. Following the application of electrodes and the deposition of a protective layer upon the resultant structure, a forward bias is applied to the electrodes. This results in the emission of light which is used to form a convex lens on the structure by optical chemical vapor deposition. Alternatively, the lens may be formed by first depositing a polymeric resin on a portion of the protective layer and upon the application of a forward bias to the electrodes light emitted at the p-n junction photoploymerizes the resin so as to cause hardening thereof in accordance with the intensity distribution profile of light emitted by the diode.

5 Claims, 1 Drawing Sheet

METHOD OF PRODUCING LED LENS ARRAY

FIELD OF THE INVENTION

The present invention relates to a method of producing a light-emitting diode (LED) lens array, and, more particularly, to a method of producing an LED lens array designed for use in an optical printer.

BACKGROUND OF THE INVENTION

Electrophotographic optical printers using a laser light source have been in use for some time. Recently, the use of optical printers, which have an LED array as the light source, have gained considerable popularity. These printers require an LED device for modulating light emitted by the LED array to form an Heretofore, this end has been attained by combining the LED with a self-focussing lens, an optical fiber array, or a similar optical waveguide.

Unfortunately, these prior art arrangements suffer from certain inherent limitations caused by optical coupling which leads to a high degree of optical attenuation and an unsatisfactory output efficiency. Efforts to enhance optical input include the use of an optical chemical-vapor deposition (CVD) or photo polymerization process, each of which permits formation of lenses directly on LEDs. However, in order to fabricate a material that will constitute the lens at a designated position, it is necessary to expose that position to focussed light. In view of the fact that a typical light emitting diode array comprises several thousand elements, lenses prepared in this manner must be formed in many regions. This type of process is extremely time-consuming and inefficient.

Recently, efforts to overcome this difficulty have focused upon the preparation of an LED array head which forms a light source for exposure that may be used to simultaneously expose several thousand locations. However, such efforts have not been successful due to the fact that in those cases in which the exposure pitch varies from product to product, or lot to lot, the technique is not applicable.

SUMMARY OF THE INVENTION

In accordance with the present invention, the aforementioned prior art limitations are effectively obviated by a method for preparing an LED lens array in which the light emanating from the constituent LEDs of the array is used as a light source for directly forming lenses on the LED array. In this manner, productivity is enhanced while concurrently decreasing attenuation.

This end is attained by a technique which comprises forming a lens array on a semiconductor substrate that focuses light from LEDs, depositing a mask in a desired pattern over the LEDs and permitting light from the LEDS to pass through the mask to form the lens array by optical chemical vapor deposition or photopolymerization. Thus, the lens array is formed by optical CVD or photopolymerization solely from light emitted by the LEDs. This eliminates the need for additional exposure means and permits an efficient generation of the lens array.

The invention will be more readily understood by reference to the following detailed description taken in conjunction with the accompanying drawing and claims.

DETAILED DESCRIPTION OF THE INVENTION

Figure 1:
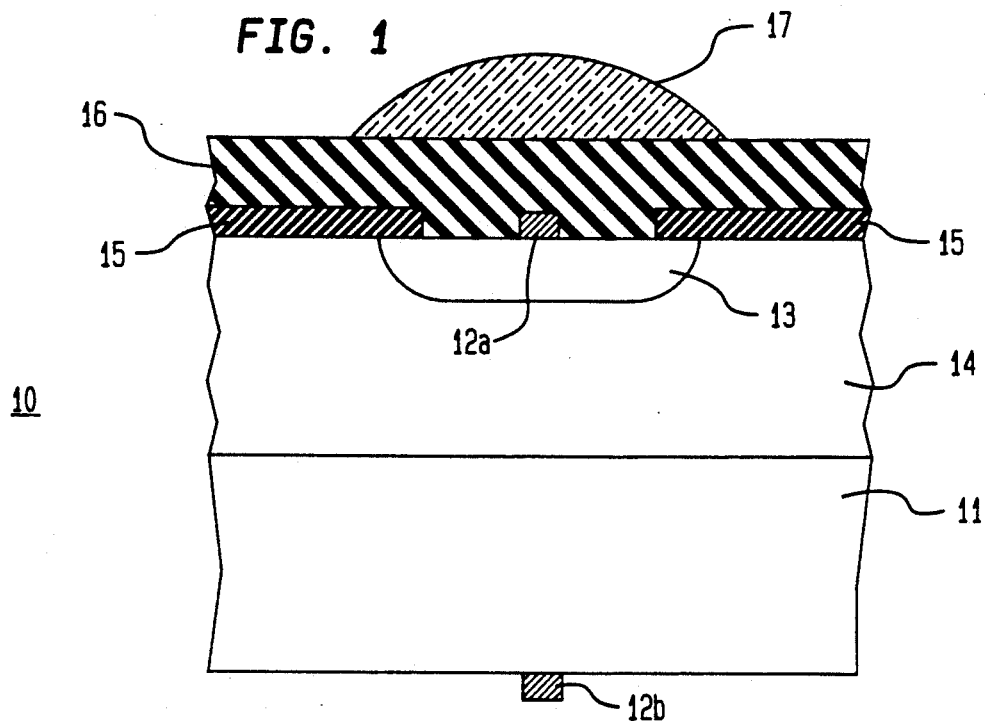
FIG. 1 is a cross-sectional view of an LED array in accordance with the invention.

Referring now to FIG. 1, there is shown a cross-sectional view of a portion of an LED array 10 in accordance with the present invention. Only one LED element is shown of the LED array 10. The LED array 10 shows one LED element which comprises a semiconductor substrate 11 with an n-type conductivity layer 14 thereover and a p-type conductivity region 13 in a portion of layer 14. A mask 15 is disposed along a common top surface of layer 14 and region 13. A first electrode 12a is disposed on a portion of the top surface of region 13. A protective layer 16 covers mask 15. A second electrode 12b is disposed on a lower surface of substrate 11. A lens 17, prepared as described hereinbelow, is disposed upon protective layer 16.

In the fabrication of lens array 10, each of the LED elements bears a lens 17 which functions as a means for focusing light emitted by the LEDs, thereby reducing attenuation.

Figure 2:
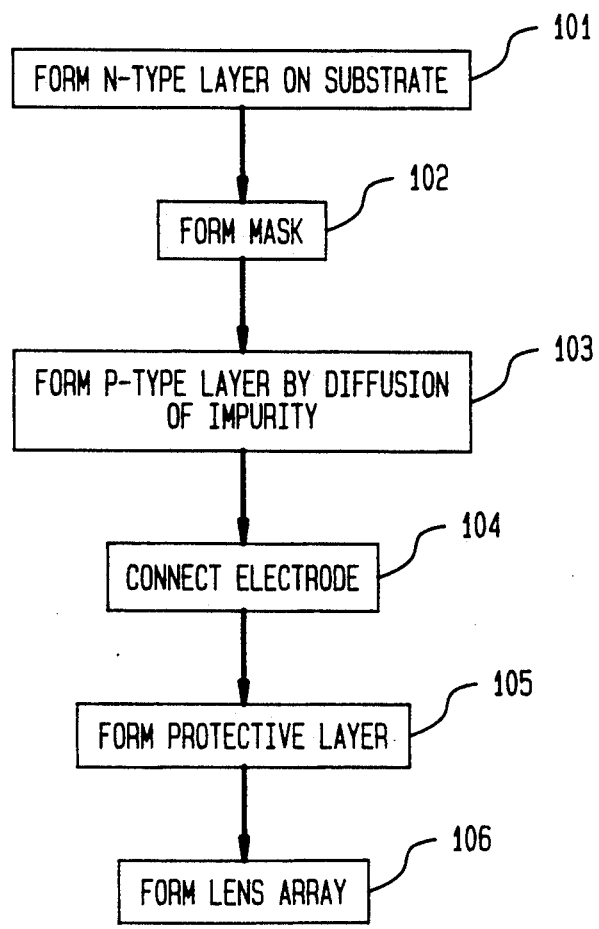
FIG. 2 is a schematic representation of the LED array fabrication technique in accordance with the invention.

Referring now to FIG. 2, there is shown a schematic representation of a method in accordance with the present invention which is useful to fabricate the LED array 10 shown in FIG. 1. In a first step, designated 101, an n-type conductivity layer 14 is formed upon a substrate 11 by conventional semiconductor processing techniques. Following, in step 102, a mask 15 is deposited upon the n-type conductivity layer 14 by conventional photolithographic techniques in a pattern in which a portion of the layer 14 remains exposed. In step 103, a p-type conductivity region 13 is formed by diffusion or ion implantation and then diffusion of impurities through an open portion of mask 15. This results in the formation of a p-type conductivity region 13 in a portion of the n-type conductivity layer 14 and thus there is formed a p-n junction at the interface between the p-type region 13 and the n-type layer 14. Light emission may then be produced by injection of suitable carriers in the region of the p-n junction.

Following formation of the junction, in a step 104, a first electrode 12a is formed on the p-type layer 13 by any conventional vapor deposition process. At this juncture, a second electrode 12b is similarly formed on the lower surface of the substrate 11. Then, a protective layer 16 is formed on the first electrode 12a and the LED is energized by applying a forward bias to electrode 12a and electrode 12b on the lower surface of the substrate 11. The light emitted by such energy is then used to form lens 17 by optical chemical vapor deposition or by photopolmerization of a resinous polymer deposited on a portion of protective layer 16.

As noted, application of a forward bias to the electrodes results in the emission of light at the p-n junction through protective layer 16. However, in the area surrounding the p-n junction, the intensity of the light is reduced by the presence of mask 15. At the central portion of the p-n junction there is no impediment to the light. This results in light of relatively high intensity as compared with light emitted from the peripheral portions of the structure. Accordingly, a profile is created in which the intensity of the light emitted through mask 15 is sinusoidal, that is, highest at the center and decreasing with increasing distance from the center. This output profile is then utilized to form convex lens 17, either by the use of optical CVD techniques or by photopolymerization using light emitted by the LEDs.

The optical CVD process alluded to is a known technology wherein optical energy is used to grow films on a substrate by thermochemical vapor phase reactions. In this process, light emitted by the LEDs affects the optical CVD process and yields a film which corresponds with the intensity distribution profile of the light. This results in the formation of a convex lens since a layer is formed which is highest at the center and thinner as it approaches its periphery.

In the photopolymerization process, optical energy is used to induce liquid phase chemical reactions such as the hardening of a polymeric resin. In the described process, when light emitted by the LEDs is used to effect photopolymerization, a polymeric resin is selectively hardened in accordance with the intensity distribution profile of the light. The non-hardened portions of the resin are then removed, so leaving a convex lens with the resin being thickest at the center and thinner toward the periphery.

While the invention has been described in detail in the foregoing specification, it will be understood by those skilled in the art that variations may be made by those skilled in the art without departing from the spirit and scope of the invention. Thus, for example, other types of LEDs or laser diodes may be substituted for diffusion LEDs as the light source. Furthermore, the LED arrays fabricated in accordance with the described technique need not be limited to optical printers and may be used in systems such as optical computers and the like.

What is claimed is:

1. A method of fabricating a lens array on a light emitting diode array comprising the steps of:
   forming a light emitting diode array on a semiconductive substrate
   depositing a mask upon the light emitting diode array; and
   biasing the light emitting diode array so as to cause light to be emitted therefrom which passes through the mask to form a lens array by optical chemical vapor deposition or by photopolymerization of a polymeric resin.

2. A method of fabricating a lens array on a light emitting diode array comprising the steps of:
   forming an n-type conductivity layer upon a semiconductor substrate;
   depositing a photomask upon the n-type conductivity layer by photolithographic techniques in a desired pattern so as to expose a portion of the n-type conductivity layer;
   forming a p-type conductivity region in a portion of the n-type conductivity layer by addition of an impurity therein in the exposed portion of the n-type conductivity layer so as to form a p-n junction at the interface between the p-type region and n-type conductivity layer;
   forming a first electrode on the p-type conductivity region;
   forming a second electrode on a lower surface of the substrate;
   depositing a protective layer on the p-type conductivity region, the photomask and the first electrode; and
   applying a forward bias to the first and second electrodes so as to cause the emission of light and the formation of a convex lens array overlying the protective layer by optical chemical vapor depositing or by photopolymerization of a polymeric resin.

3. The method of claim 2 wherein the lens array is formed by the use of optical chemical vapor deposition.

4. The method of claim 2 wherein the lens array is formed by the use of photopolymerization techniques wherein a lens material comprising a polymeric resin is deposited upon the protective layer prior to applying the bias to the first and second electrodes.

5. The method of claim 4 wherein a polymeric resin is selectively hardened in accordance with the intensity distribution profile of light emitted by the diode.

* * * * *